(12) United States Patent
Leyonhjelm

(10) Patent No.: US 6,947,711 B1
(45) Date of Patent: Sep. 20, 2005

(54) METHOD AND APPARATUS FOR GENERATING A RADIO FREQUENCY SIGNAL

(75) Inventor: Scott Allan Leyonhjelm, Sundbyberg (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 370 days.

(21) Appl. No.: 10/130,598

(22) PCT Filed: Nov. 23, 2000

(86) PCT No.: PCT/SE00/02312

§ 371 (c)(1),
(2), (4) Date: Jul. 2, 2002

(87) PCT Pub. No.: WO01/39367

PCT Pub. Date: May 31, 2001

(30) Foreign Application Priority Data

Nov. 24, 1999 (EP) .................................. 99850179

(51) Int. Cl.⁷ .............................................. H04B 1/04
(52) U.S. Cl. ................................. 455/114.3; 375/297
(58) Field of Search .................... 455/114.2, 114.3, 455/127.1, 127.2, 550.1, 103; 375/296, 297; 330/149

(56) References Cited

U.S. PATENT DOCUMENTS

| | | | |
|---|---|---|---|
| 4,291,277 A | | 9/1981 | Davis et al. |
| 4,725,901 A | * | 2/1988 | Eiberger et al. ............... 360/45 |
| 5,049,832 A | | 9/1991 | Cavers |
| 5,732,333 A | * | 3/1998 | Cox et al. .................... 455/126 |
| 5,745,006 A | * | 4/1998 | Budnik et al. ............... 330/149 |
| 5,898,338 A | | 4/1999 | Proctor et al. |

FOREIGN PATENT DOCUMENTS

| | | |
|---|---|---|
| WO | WO 98/12800 | 3/1998 |
| WO | WO 99/45638 | 9/1999 |
| WO | WO 99/45640 | 9/1999 |

OTHER PUBLICATIONS

Briffa; "Linearization of RF Power Amplifiers"; A thesis submitted for the degree of Doctor Philosophy at Victoria University of Technology; Dec. 1996; pp. 6-37.

Cripps; "RF Power Amplifiers for Wireless Communications"; 1999; pp. 225-228.

* cited by examiner

Primary Examiner—Nguyen T. Vo
(74) Attorney, Agent, or Firm—Nixon & Vanderhye P.C.

(57) ABSTRACT

The invention relates to linearization of a radio frequency (RF) power amplifier (5) by predistortion. Digital predistortion is performed (1) on received digitized base-band input signals to compensate for amplifier distortion. The resulting signal is converted to an analog signal via two D/A converters (2), after which analog frequency conversion is performed (3) on the analog signal to achieve a radio frequency (RF) signal. This radio frequency signal is exposed to analog predistortion (4) and thereafter amplified by the power amplifier.

9 Claims, 7 Drawing Sheets

METHOD AND APPARATUS FOR GENERATING A RADIO FREQUENCY SIGNAL

This application is the US national phase of international application PCT/SE00/02312 filed 23 Nov. 2000, which designated the US.

TECHNICAL FIELD

The present invention relates to a method and an apparatus for generating a radio frequency (RF) signal, and more particularly to linear amplification of radio frequency signals.

BACKGROUND ART

In a radio base station, there is a need for a high power amplifier in the transmitter section to provide each radio channel with enough power to reach the outer limits of a cell covered by a base station.

When using the same amplifier for simultaneous amplification of several information signals modulated on different carrier waves or when using linear modulation, such as QAM (Quadrature Amplitude Modulation), high amplifier linearity is required. This is because it is essential in this case to maintain all phase and amplitude positions of the signal components involved in the amplification. Otherwise intermodulation will occur between the signal components and the spectrum of the amplified signal will broaden. Intermodulation distortion will interfere with signals on other channels. Examples of systems, wherein high linearity is required, are those in which several combined narrow-band signals or wide-band signals such as CDMA need to be amplified.

RF power amplifiers are inherently non-linear devices since they generate unwanted intermodulation products, which manifest themselves as spurious signals in the amplified output signal, separate and distinct from the input signal. The distortion introduced by an RF amplifier causes the phase and amplitude of its amplified output signal to depart from the phase and amplitude, respectively, of the input signal.

There exist different methods for linearising amplifiers. An overview and reference list of linearisation methods, including Back-off of class A, Feedforward, Vector summation, Feedback and Predistortion Linearisation, is given in "Linearisation of RF Power Amplifiers" by Mark. A. Briffa, department of Electrical and Electronic Engineering, Victoria University of Technology, December 1996, Australia.

Predistortion is a method that modifies the original input signal to the power amplifier such that it is complementary to the distortion characteristics of the power amplifier. The cascaded response of complementary predistortion and amplifier distortion should therefore result in a linear response. Typically the complementary predistortion function is based on the approximation of the amplifier being modelled by a power or a voltera series (otherwise known as the AM/AM & AM/PM). However, the complementary predistortion function could also include higher order effects, such as thermal properties of the transistor and/or frequency dependent properties due to the bias and matching circuits. Predistortion can be applied at radioor Intermediate frequencies, known as analog predistortion, or applied at baseband, known as digital predistortion. Additionally, to achieve excellent linearity, adaption of the predistortion means is needed to circumvent changes due temperature, component ageing etc.

The predistortion mechanism may be made adaptive by extracting the error distortion signal component at the output of the RF amplifier and adjusting the predistortion means in accordance with the extracted error behaviour of the RF amplifier during real-time operation, so as to effectively continuously minimize distortion at the amplifier's output. A good overview of digital predistortion adaptive means is given in J. K. Cavers, "Amplifier linearisation by adaptive predistortion", U.S. Pat. No. 5,049,832. International patent applications WO 99/45638 and WO 99/45640 provide examples of an analog predistortion adaptive method.

To achieve good results with analog predistortion, careful matching of the complementary predistortion function and amplifier distortion function is required. However, analog elements with excellent matching characteristics are very difficult and expensive to produce. Analog predistortion typically has a limited dynamic (operation)range and is therefore only able to produce limited performance improvements. Analog predistortion, however, can operate over large bandwidths.

On the other hand, adaptive digital predistortion is able to produce, in theory, the excellent matching properties required to achieve significant improvements in linearity. However, because the predistortion occurs at baseband, it needs to be converted to radio frequency before it can be amplified. The frequency conversion, however, takes place in the analog domain, which by its nature destroys the perfect matching capabilities of the digital domain. This results in that also digital predistortion becomes limited in respect of performance and bandwidth compared to analog predistortion.

The frequency dependent properties of the analog frequency conversion process, amplitude ripple and phase ripple, are the basic mechanisms for destroying the digital domain's matching qualities. Both of these quantities are directly linked to the amount of performance improvement that can be obtained. As the amplitude and phase ripple quantities increase, the obtainable linearity performance improvement becomes reduced, regardless of how well matched the complementary function is in the digital domain.

Analog and digital predistortion linearisation are typically implemented as standalone techniques, because of practical implementation problems arising from the fact that the two solutions require different architectures for implementation. This is best illustrated in the following two examples. In a normal macro base station, the Power Amplifier (PA) is a module that fits in one part of the rack, sometimes included with the frequency conversion circuits. The digital base band processing circuits physically reside in another part of the rack. These two components are physically separated and the signals are communicated via a coaxial cable. In a mast mounted antenna application, the PA is at the top of the mast and the base band processing part is at the base of the mast. In both examples, the digital baseband processing parts and the PA module are physically separated, which introduces practical implementation problems.

However, there exist some examples of a combined linearisation solution. For example the combination of digital predistortion with feedforward is presented in WO 98/12800. The feedforward architecture requires additional signal paths and two couplers, one to acquire the signal out of the power amplifier (PA) and the other one to subtract the remaining PA distortion. The last coupler inserts a loss. This results in the overall efficiency being degraded, also when combining the two methods. The solution is also quite complicated, requiring a large amount of components, making it difficult to implement.

Another example of combining RF predistortion with Feedforward is described in the technology white paper, 'Multi-Carrier Power Amplifiers join the Digital Revolution' Yuval Shalom, Fall 1999 issue of Site management and Technology Magazine, Intertec Publishing. It states that the DC-RF efficiency of feedforward amplifiers is limited to around 6–8% because of three factors.

1) Large backoffs due to the large peak to average ratios of multicarrier (wideband) signals. The DC power supplied to the power amplifier is given by $P_{DCamp}$, and the RF output power from the amplifier is given by $P_{RF}$.

2) Additional hardware such as delay lines and couplers after the power amplifier introduce insertion (power) loss. The power loss can be defined as a fraction of the total power surviving after the loss, typically 0.8 i.e 20% (1 dB) of power is lost.

3) DC power consumed ($P_{DCother}$) by other parts of the feedforward system i.e. error amplifiers, control circuitry.

The DC-RF efficiency formula can be approximated for the combined feedforward and RF predistortion system as $$DC\text{-}RF \text{ efficiency}=0.8*P_{RF}/(P_{DCother}+P_{dcamp})$$

In the case of a predistortion system only, there is no need for the additional hardware that introduces losses in a feedforward system. As regards the other parts of the feedforward system, this reduces complexity and results in the DC-RF efficiency increasing as shown below by the DC-RF efficiency formula for predistortion:

$$DC\text{-}RF \text{ efficiency}=P_{RF}/P_{Dcamp}>0.8*P_{FR}/(P_{DCother}+P_{Dcamp})$$

Wide band applications partly have to be designed with architectures and solutions different from those of the narrow band solutions because of different problems.

Predistortion is a quasi-closed loop power amplification system, as opposed to a closed loop system. Closed loop systems are based on feedback, i.e. Cartesian feedback, envelope feedback, polar feedback.

The advantage of quasi-closed loop systems is that both narrowband and wideband systems of an order of magnitude of 10's of MHz can be used. As opposed to this, closed systems are limited to narrow band signals of an order of magnitude of 100's of kHz for practical stability reasons, although they can usually achieve higher levels of linearisation than quasi-closed loop systems.

In addition to quasi-closed and closed loop systems, feedforward amplification can be used that can result in both high levels of linearity and transmittance of wideband signals. As compared to predistortion methods this requires a rather complicated gain and phase tracking mechanism to keep the loops in balance and results in low power efficiency. The feedforward architecture is currently the most widely used technique for linearising applications in wideband radio. For wideband radio applications, predistortion, both analog and digital methods, in general is characterized by good power efficiency, as compared to the use of the feedforward methods, although they have lower linearity performance than feedforward.

Digital predistortion has not been technologically possible to use for wide band signals earlier with a sufficient performance because of a relatively slow digital signal processing and limited precision. The development of faster digital signal processing by the introduction of e.g. digital circuit fabrication methods, and advancements in DAC (Digital to Analog Converter) technology, has, however, remedied this problem.

However, use of digital predistortion techniques in wide band systems accentuates problems appearing in connection with upconversion of the base band signal to a radio signal, since the frequency dependent properties of the analog frequency conversion process limit performance improvement.

The analog frequency upconversion process is usually assumed to have the same transfer function regardless of frequency, viz.:

$$Y=f''(X)$$

wherein Y is the output signal, and is a function of the input signal X. Typically the frequency conversion circuitry is designed such that Y is linearly related to X, and this assumption is relevant to narrow band signals. In wideband signal applications, the frequency upconversion process becomes more dependent on frequency:

$$Y=f''(X,\text{frequency})$$

This frequency dependence destroys perfect digital predistortion matching properties, and therefore limits the amount of linearisation. The dependence on frequency can be reduced, but it becomes expensive, if not impractical, to design over a wide bandwidth with very low amplitude and phase ripple. That is, low enough amplitude and phase ripple allowing digital predistortion to achieve the desired level of linearity. A digital frequency equaliser could be used to negate the frequency upconverter's frequency dependence. However, there will always exist some residual frequency dependence that limits the amount of linearisation, and it will also increase the complexity of the solution.

It is an object of the invention to provide an improved linearisation method by using digital predistortion in both wide band and narrow band applications, that will overcome the frequency conversion problems in connection with digital predistortion.

SUMMARY OF THE INVENTION

The method of the invention for linearisation of a radio frequency (RF) power amplifier by predistortion, comprises the steps of receiving a digitized base-band input signal, to be amplified by said RF power amplifier, performing digital predistortion of the signals to compensate for amplifier distortion, converting the signal to an analog signal via two D/A converters, performing analog frequency conversion to achieve a radio frequency (RF) signal, performing analog predistortion of the RF signal, amplifying the analog predistorted signal by said RF power amplifier.

The power amplifier of the invention is characterized by means for performing the above steps of the invention. Alternatively, the digitally predistorted signal could be converted to a low digital intermediate frequency in the method and the power amplifier of the invention, whereafter the signal can be converted to an analog signal by using only one D/A converter. Both of these solutions can also be used in such another architecture of the invention, wherein the received base-band input signal can be split into two signals of 90° phase difference, whereafter the rest of the steps of the method of the invention is performed for each of the signals.

In all embodiments of the invention, the predistortion can be made adaptive to further improve the performance and/or circumvent changes due to temperature, component ageing etc.

Furthermore, the invention can be used in connection with different architectures described later.

The invention has several advantages as compared to prior predistortion solutions. By solving the upconversion problems caused by the digital predistortion process by splitting the performance requirements between digital and analog predistortion, improved linearity is achieved compared to digital predistortion alone. The solution of the invention also gives a higher efficiency compared to feedforward linearisation techniques, especially for wide band systems.

The invention also has the advantage of reduced requirements on frequency conversion parts since the linearisation performance now partly is handled by the analog predistortion means. This results in a cheaper frequency conversion solution.

The physical separation of the digital base-band processing parts and the PA module in prior art solutions exemplified above was one of the problems to overcome so that a combination of analog and digital predistortion would be possible.

One of the merits of the invention also lies in the fact that the overall performance improvement can be enhanced by splitting it between digital predistortion and analog predistortion. For example, if the basic amplifier gives a performance of −30 dBc and 30 dB improvement is required, an overall performance of the linearisation of −60 dBc is needed. Then digital predistortion could obtain an improvement of 20 dB and the analog predistortion one of 10 dB. This makes a total linearisation solution possible, which is very difficult practically or impossible to achieve with digital or analog predistortion alone. For digital predistortion to achieve this alone would require stringent design requirements on the frequency upconverter resulting in either an impossible design requirement or a very expensive solution. For analog predistortion to achieve this alone would require excellent matching of the complementary predistortion function and amplifier distortion function, and analog parts with excellent matching characteristics are very difficult and expensive to produce.

Another merit of the invention is that it combines the natural strengths of analog and digital predistortion. That is analog predistortion has limited correction capabilities over a large frequency range, whilst digital predistortion has excellent correction capabilities over a narrower frequency range. The combination can therefore yield improved correction capabilities over all frequency ranges when compared to either digital or analog predistortion techniques alone.

The invention will now be described more closely with reference to the appended drawings on which:

Figure 3:
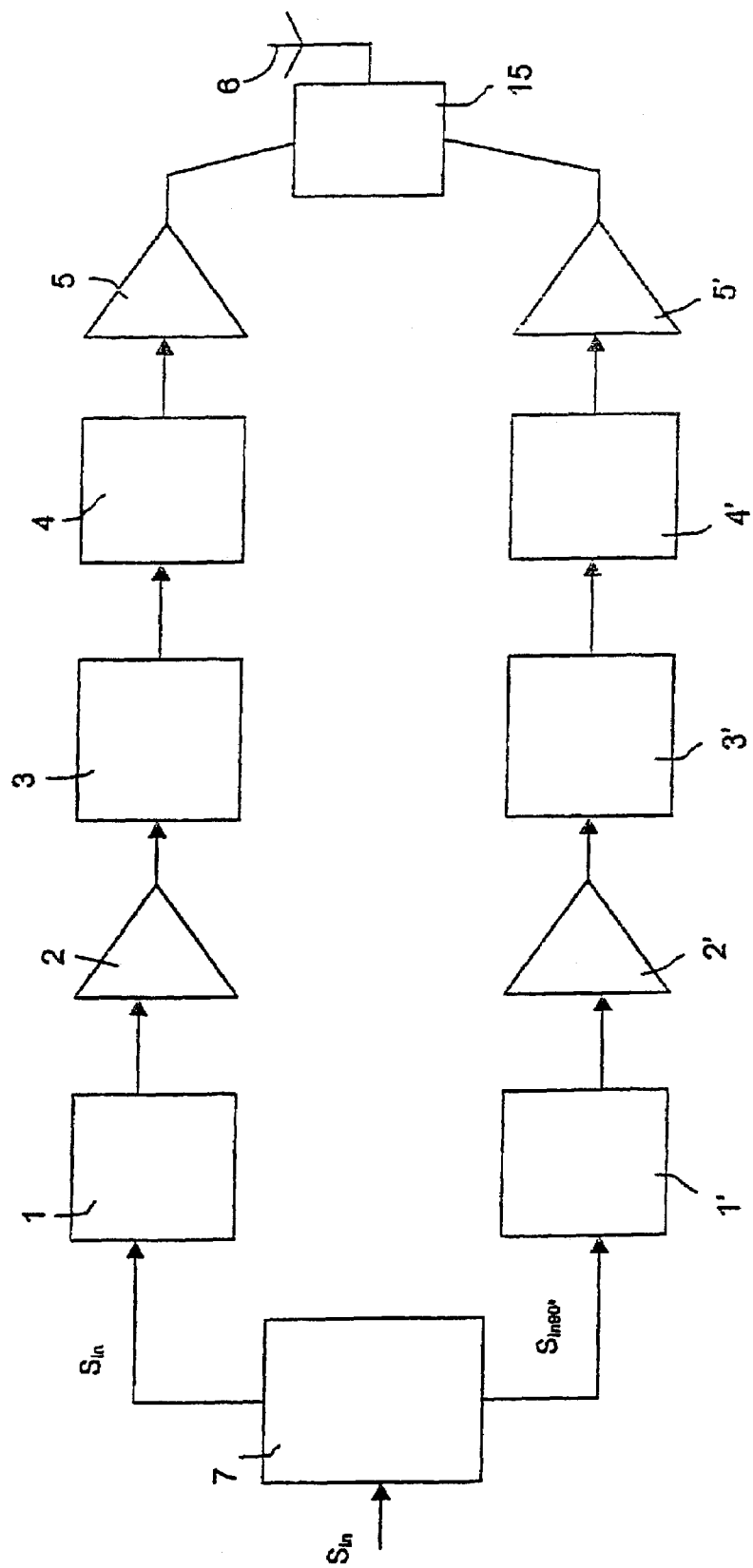
Figure 4:
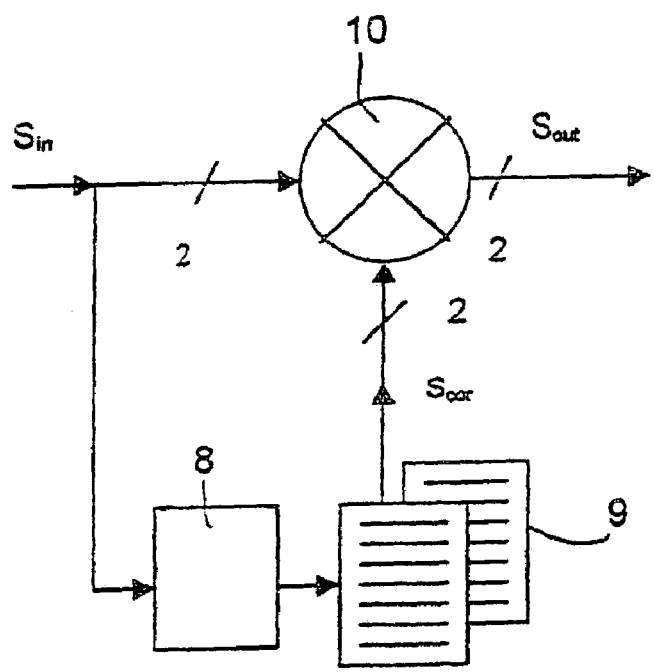
Figure 5:
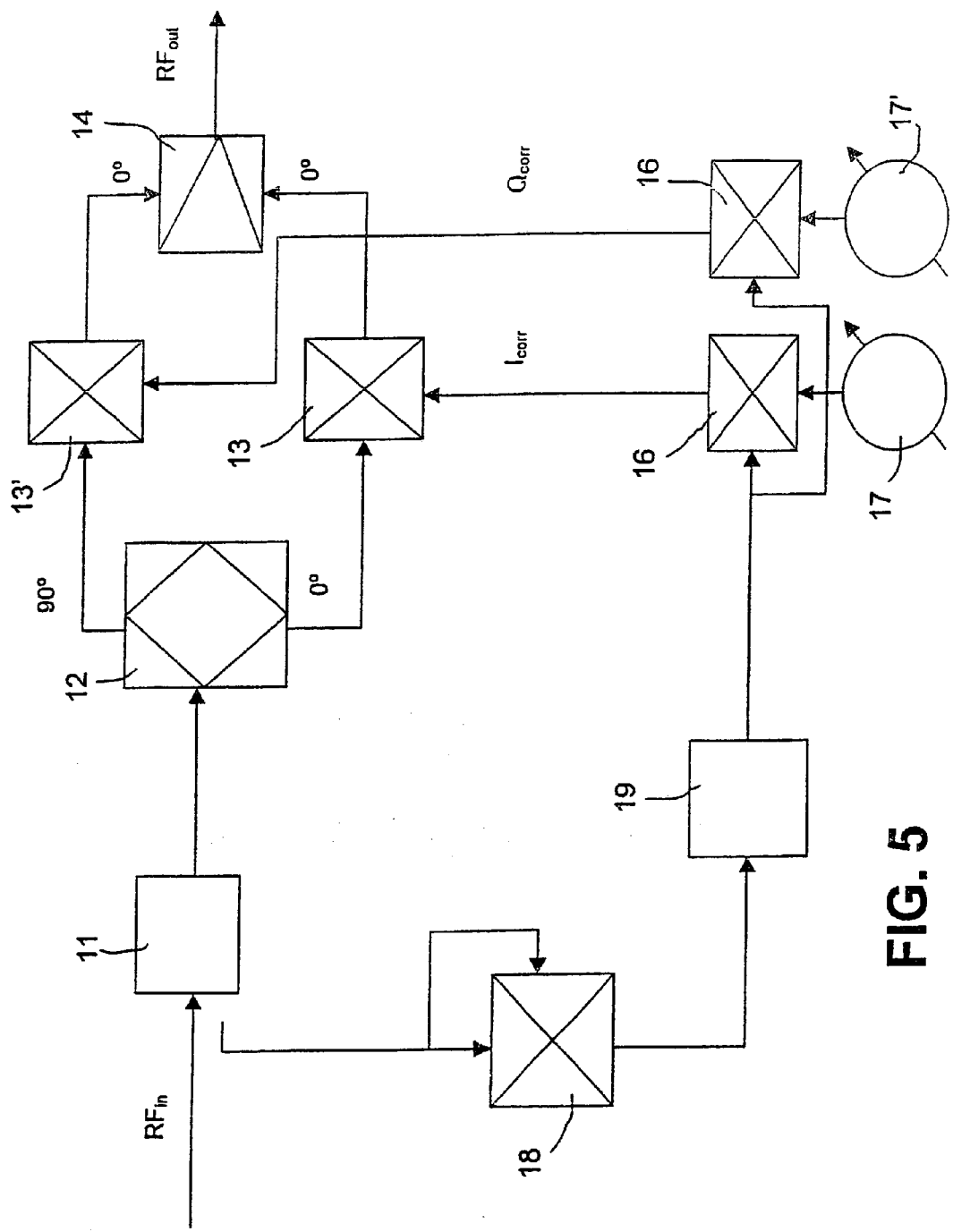
Figure 6:
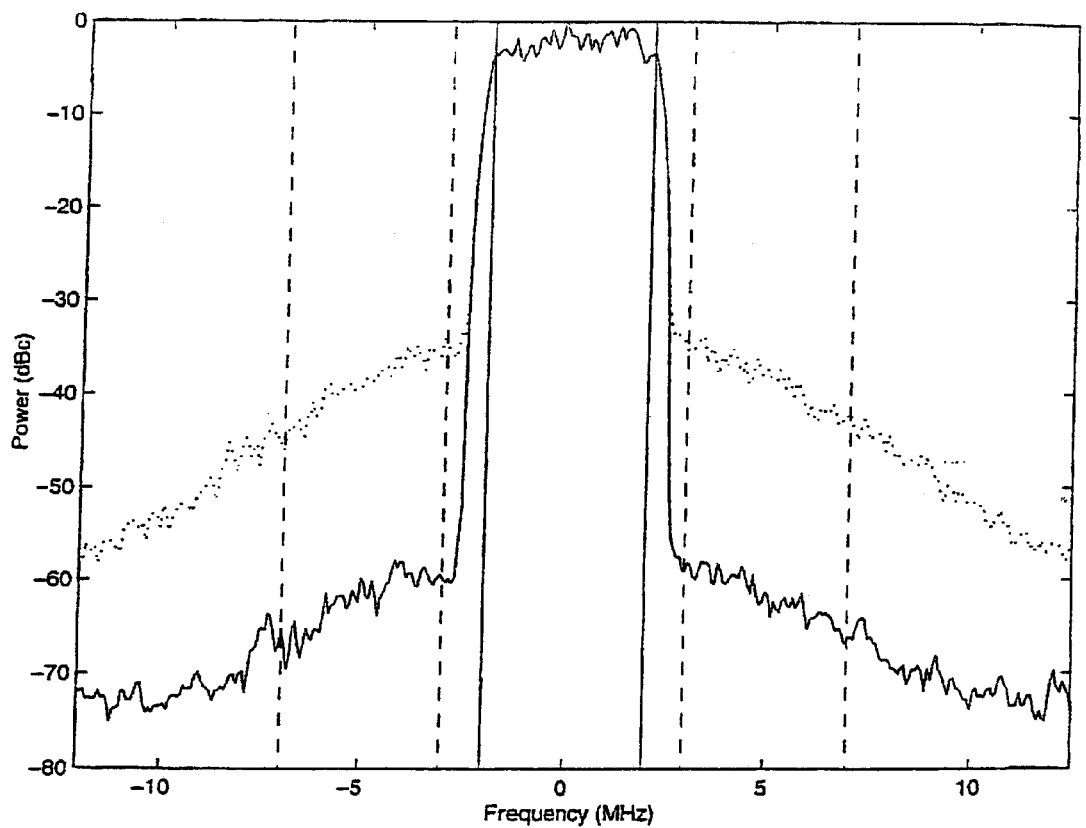
Figure 7:
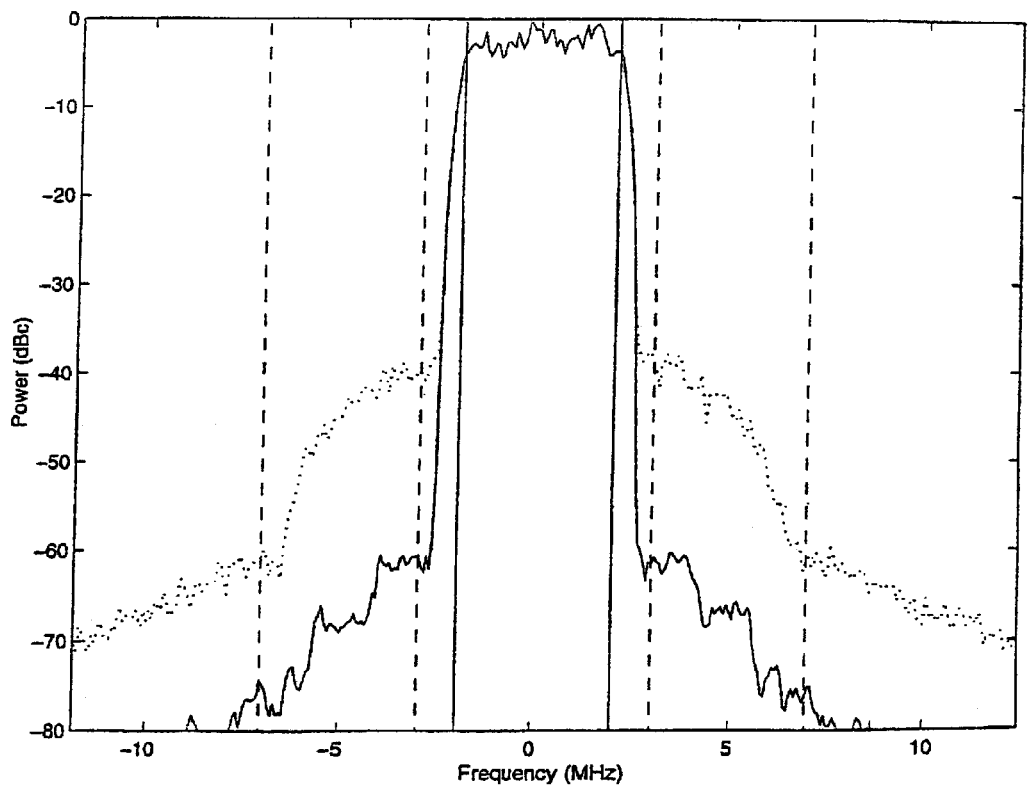

FIG. 3 shows an example of an embodiment of the invention as implemented in the Doherty architecture, FIG. 4 shows an example of the digital predistortion part of the invention more in detail, FIG. 5 shows an example of the the analog predistortion part of the invention more in detail, FIG. 6 shows simulation results of a digital predistortion method of prior art, FIG. 7 shows simulation results of the method of the invention.

DETAILED DESCRIPTION

Figure 1:
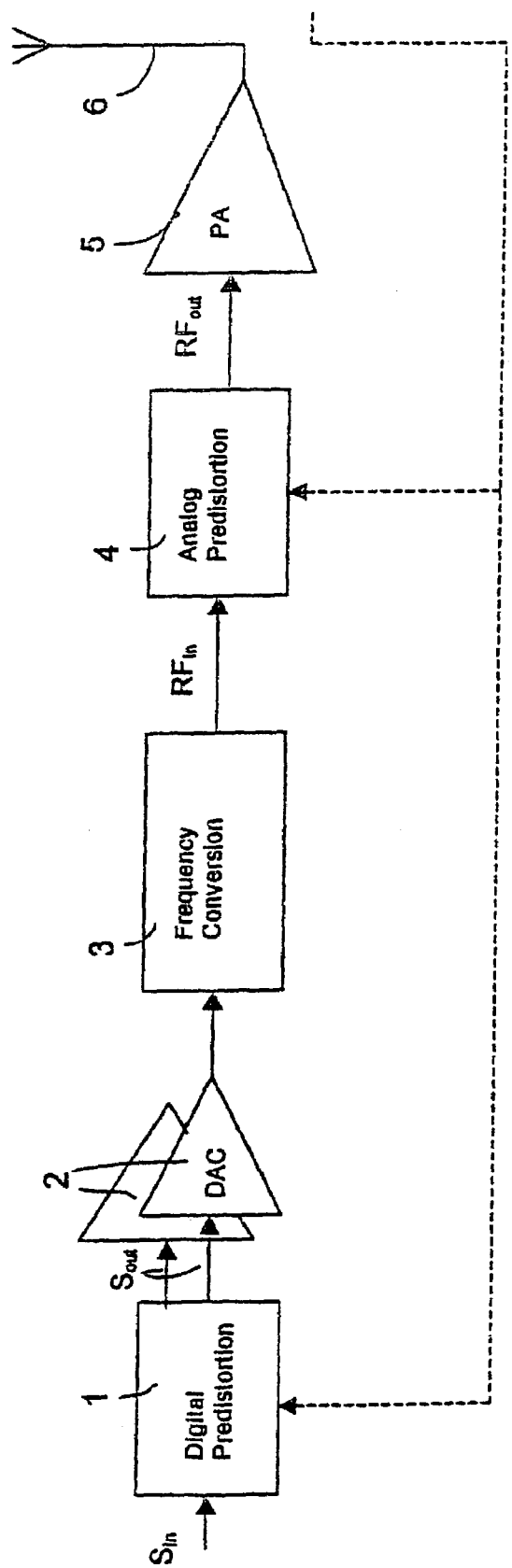
FIG. 1 is a schematic block diagram illustrating principles of the invention.

With reference to FIG. 1, a digitized complex baseband input signal $S_{in}$ is first predistorted, as indicated by block 1, to produce a complex baseband digital predistorted output signal $S_{out}$. More particularly, this is done in a manner to be complementary with respect to a combination of an analog predistorter and a power amplifier, discussed further below and indicated by blocks 4 and 5, respectively. This combination of an analog predistorter and a power amplifier can be thought of as forming a linear power amplifier.

The complex baseband digital predistorted signal $S_{out}$ is then converted to an analog signal by two Digital to Analog Converters (DAC), indicated at 2. Alternatively, although not shown in FIG. 1, the baseband digital predistorted signal $S_{out}$ can be first digitally frequency converted, before being converted to an analog signal via a single DAC.

The output from the DAC is then frequency converted by frequency conversion circuits, indicated by block 3, to a radio frequency signal $RF_{in}$. The frequency conversion circuits 3 can consist of mixers, filters, amplifiers etc. arranged in a manner obvious to a man skilled in the art. The frequency conversion process introduces frequency dependent amplitude and phase ripple, that partly destroys the linearisation ability that can be achieved with digital predistortion alone. The signal $RF_{in}$ containing the frequency converted digitally predistorted signal, is now exposed to analog predistortion as indicated by block 4, in a complementary manner with respect to the power amplifier 5. The RF predistorted signal, $RF_{out}$, is then passed through the power amplifier 5 before being transmitted by an antenna 6.

The digital and analog predistorters 1 and 4, respectively, can optionally be made adaptive to further improve the linear performance and/or circumvent changes due to temperature & ageing etc. The adaption operation, which can be carried out with methods well known in art, is indicated by dotted lines ended by an arrow at each one of the blocks 1 and 4 in FIG. 1.

Figure 2:
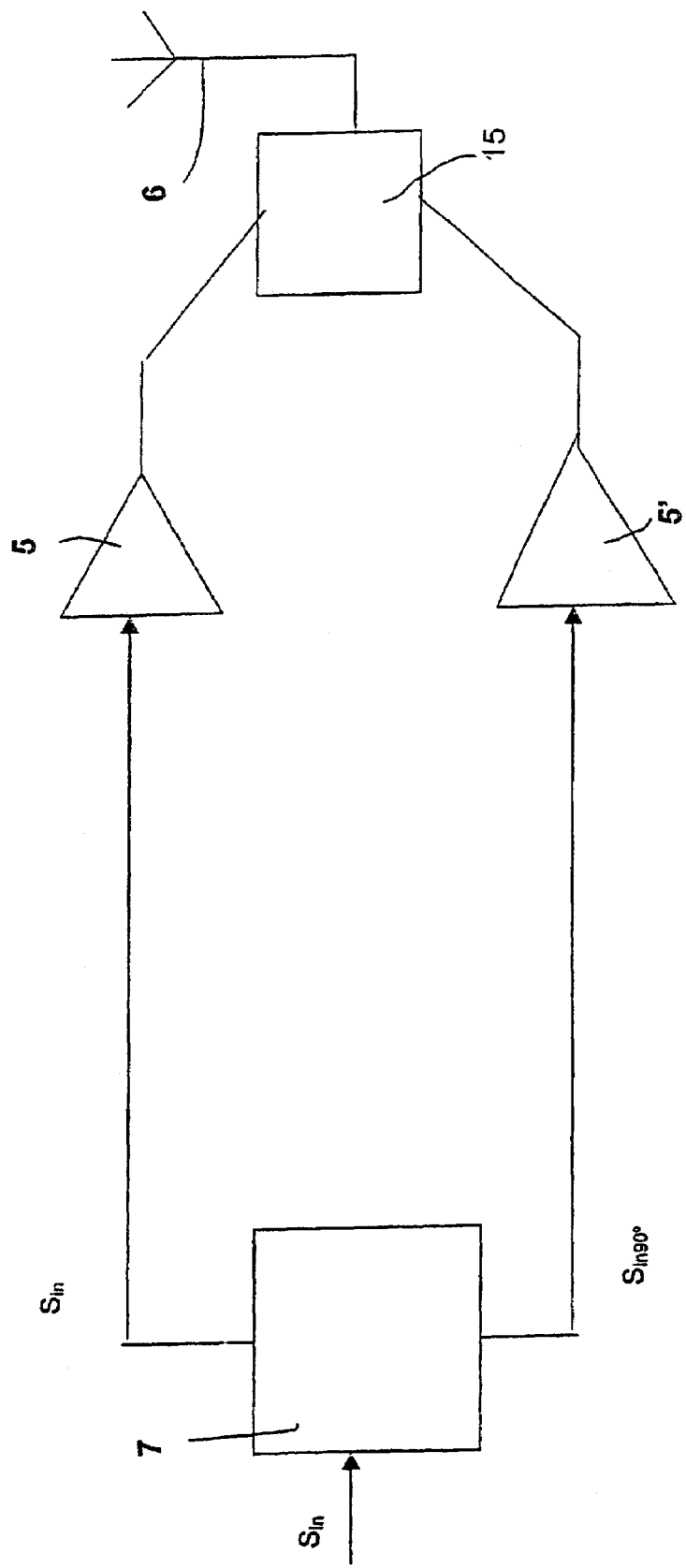
FIG. 2 shows a Doherty amplifier architecture according to prior art.

FIG. 2 schematically illustrates a so called Doherty amplifier. The architecture of a Doherty amplifier is e.g. described in "RF Power Amplifiers for Wireless Communications" by Steve C. Cripps (ISBN 0-89006-989-1, Artech House, 685 Canton Street, Norwood Mass. 02062). According to the basic concept of this amplifier, two amplifier devices 5, 5' are used in parallel and the final maximum RF output power is produced by the combined power of both devices. The Doherty amplifier constitutes an efficiency enhancement technique as compared to a one amplifier device technique, but does not introduce any linearisation improvements. In short, an incoming base band signal $S_{in}$ is quadrature split, indicated by block 7, into two signals with 90° phase difference. The two signals are amplified by the amplifier devices 5, 5', combined as indicated by block 15, and then transmitted by an antenna 6.

With reference to FIG. 3, the performance of the Doherty amplifier can be improved with respect to linearisation by introducing therein the solution of the present invention, as described with reference to FIG. 1. The incoming base band signal $S_{in}$ is first split, indicated by block 7, into a first signal $S_{in}$ being identical to the input signal, and a second signal $S_{in90°}$ being 90 degrees phase shifted. The 90 degree phase shift can be implemented by the so called Hilbert Transform, or according to other methods obvious to a man skilled in the art.

The two signals $S_{in}$ and $S_{in90°}$ are processed in each a path containing the same type of function blocks as in FIG. 1, described earlier, said paths extending in parallel from block 7 to a combiner indicated by block 15. The top path blocks are numbered 1, 2, 3, 4 and 5 as in FIG. 1, whereas the lower path blocks are numbered 1', 2', 3', 4' and 5'. The top path, receiving the original signal, includes the main power amplifier 5, whereas the lower path, receiving the 90 degrees phase shifted signal, includes a peak or auxiliary amplifier 5'.

The output signals from the amplifiers 5 and 5' are combined in the combiner 15 after the signal of the top path having been shifted by 90 degrees. Typically, the combination may be implemented as a quarter wave delay after the main power amplifier 5 output. The combined output signal from the combiner 15 is then transmitted by the antenna 6.

Applying, as described above, the invention on the Doherty architecture improves the linearity of the power amplifiers used, and makes it more suitable for use in both narrow band and wide band radio communication systems.

FIGS. 4 and 5 illustrate some simple examples of digital and analog predistortion methods that can be used in connection with the invention, assuming in these Figures that the amplifier is memoryless. What is referred to is use of AM/AM (amplitude modulation/amplitude modulation), AM/PM (amplitude modulation/phase modulation) model of amplifier.

If the power amplifier is exposed to memory effects such as caused by thermal properties of the power transistor and/or frequency dependent properties due to the bias and matching circuits, then it is obvious to a man of the art that the digital and analog predistorters will also require memory to compensate for these effects. An example of a digital and an analog predistorter will now be described, that can be used in connection with the combination of analog and predistortion methods according to the invention.

FIG. 4 illustrates an example of a method for implementing digital predistortion of the kind referred to by block 1 in FIG. 1. The digital predistorter in this case is assumed to compensate for the combination of the analog predistorter and power amplifier with a memoryless non-linearity and is based on cartesian complex gain predistortion. Other memoryless predistorter examples could include polar complex gain or full cartesian mapping, the principles of which are described in U.S. Pat. No. 5,049,832.

In FIG. 4, the complex baseband input digital signal $S_{in}$ of FIG. 1 is received by an address generator 8. The address generator 8 generates an address based on a function of the amplitude of the signal, this being consistent with the memory non-linearity assumption of the power amplifier. The address is typically the amplitude or power of $S_{in}$ and is used to select a complementary complex gain, $S_{corr}$, from correction (predistortion) tables 9 for the digital sample in question. The correction tables 9 contain the total complementary complex gain of the combination of the analog predistorter 4 and power amplifier 5, such that the combination of the complementary gain of the digital predistorter 1, the analog predistorter 4 and the power amplifier 5 results in linear gain and phase for all input signal magnitudes. The complementary complex gain sample, $S_{corr}$, and the orignal input signal sample, $S_{in}$, are then processed by a complex multiplier 10. The output of the complex multiplier 10, $S_{out}$, is designed to linearise the combination of the analog predistorter and power amplifier. The signals used in FIG. 4 are complex, which is indicated by the number 2 at the signal paths.

FIG. 5 illustrates an example of performing $3^{rd}$ order analog RF predistortion of the kind referred to by reference number 4 in FIG. 1. The digitally predistorted signal converted to RF forms an input $RF_{in}$ to the analog predistorter 4. The $RF_{in}$ signal is delayed, as indicated by block 11, to ensure that RF signal and correction signals coincide at multipliers 13, 13'. The delayed $Rf_{in}$ signal is then split, indicated by block 12, into two signals with quadrature phase, i.e. there is a 90 degree phase shift between the two signals.

Both of the quadrature phase signals are then mixed by the multipliers 13 and 13', respectively, with the correction (predistortion) signals $I_{corr}$ and $Q_{corr}$, respectively. These signals, $I_{corr}$ and $Q_{corr}$, represent the analog complementary complex gain of the amplifier. The resulting mixed signals are then phase combined in a hybrid combiner 14. The output of the analog predistorter, $RF_{out}$, is designed to linearise the power amplifier.

The correction signals, $I_{corr}$ and $Q_{corr}$, are generated by first squaring, as indicated by squaring function block 18, the input signal $RF_{in}$, then filtering, as indicated by filtering function block 19, away unwanted harmonics generated by the squaring function 18, and finally multiplying, as indicated by two blocks 16, the filtered signal from function 19 with two third order coefficients 17, 17'. The two third order coefficients approximate the complementary complex gain of the amplifier. It is obvious to those familiar with the state of the art that higher order coefficients can be used to achieve better matching of the complementary gain of the amplifier and that there are many other examples of analog RF predistorters, some of which are described in Mark Briffa, "Linearisation of RF Power Amplifiers", PhD thesis, 1996, department of Electrical and Electronic Engineering, Victoria University of Technology, December 1996, Australia and the international patent applications WO 99/45640 and WO 99/45638.

Simulation Results

By solving the frequency conversion problems caused by the digital predistortion process by splitting the performance requirements between digital and analog presdistortion in a way according to the invention, improved linearity is achieved, compared to digital predistortion alone. The solution of the invention also gives improved correction capabilities over all frequency ranges compared to either digital or analog predistortion techniques alone.

This can be shown through the following simulation results using a WCDMA signal with a bandwidth of 4.096 MHz. Digital predistortion linearisation only with a given power amplifier is first assumed with reference to FIG. 6.

The adjacent channel performance, or linearity performance, of the amplifier is defined as the ratio of the power of a signal to the power of adjacent signal power, on either the lower or the upper sides. The power is calculated by integrating the energy over a bandwidth of 4.096 MHz. For the signal this is shown as the area between the two vertical solid lines, and for the adjacent signal this is shown as the area between the dotted vertical lines.

The adjacent channel performance of the given amplifier alone (shown dotted in FIG. 6) is 35.8 dBc and 34.4 dBc for the lower and upper adjacent channels respectively. Applying perfect digital predistortion (the ideal complementary function of the given power amplifier) with 0.6 dB peak to peak amplitude ripple in the frequency converter results in an adjacent channel performance that (shown solid in FIG. 6) is 59.2 dBc and 58.8 dBc for the lower and upper adjacent channels respectively. The performance of the given power amplifier has been improved by digital predistortion by 23.4 and 24.4 dB, however limited by the amplitude ripple in the frequency converter.

In the next set of results, the given amplifier is first predistorted by a RF analog predistorter. With reference to FIG. 7, the adjacent channel performance (shown dotted in FIG. 7) is 41.1 dBc and 40.6 dBc for the lower and upper adjacent channels respectively. The analog predistorter has improved the given power amplifier by 5.3 dB and 5.2 dB. Notice that the analog predistorter has also improved the higher order distortions (wider frequency range) of the amplifier in this example.

Digital predistortion is now applied to the analog predistorter and the given power amplifier. Perfect digital predistortion (the ideal complementary function of the analog predistorter and given power amplifier) with 0.6 dB peak to peak amplitude ripple in the frequency converter results in an adjacent channel performance (shown solid in FIG. 7) of 63.1 dBc and 62.8 dBc for the lower and upper adjacent channels respectively. Obviously the performance of the analog predistorter and given power amplifier has been improved by a further 22 and 22.2 dB with the addition of digital predistortion.

Notice that the overall performance improvement of digital predistortion in both examples was 23–24 and 22 dB. Given measurement tolerances these values could be considered very similar. Digital predistortion has therefore been limited in performance by the ripple of the frequency upconverter, regardless of the initial linear performance of the analog parts. Additionally the overall performance improvement generated by the combination of analog and digital predistortion techniques is given by the sum of the individual improvements in the region where both digital and analog predistortion is active. This region is shown in FIGS. 6 and 7. The larger frequency range over which only analog predistortion is active, is not shown in FIGS. 6 and 7. However, the spectral performance over the larger frequency range is also enhanced but to a lesser extent than that shown in FIGS. 6 and 7.

What is claimed is:

1. A method for linearizing a radio frequency power amplifier by predistortion, comprising:
   a) receiving a digitized base-band input signal to be amplified by the amplifier,
   b) splitting the received input signal into two signals having a 90° phase difference,
   c) performing the following steps on each of the split signals:
      digitally predistorting the received signal to compensate for amplifier distortion,
      converting the digitally predistorted signal to a low intermediate frequency,
      converting the low intermediate frequency signal to an analog signal via a digital-to-analog converter,
      frequency converting the analog signal to produce a radio frequency signal,
      performing analog predistortion on the radio frequency signal,
      amplifying the analog predistorted signal in an amplifier,
   d) combining both of the amplified signals for transmission.

2. A method according to claim 1, comprising performing the analog predistortion adaptively by extracting an error signal component from the output of the amplifier to be used for adjusting the predistorted signals in accordance with an amplifier error behaviour.

3. A method according to claim 1, comprising performing the digital predistortion adaptively by extracting an error signal component from the output of the amplifier and adjusting the predistortion signal in accordance with an amplifier error behavior in real-time operation.

4. A power amplifier for linear amplification of radio frequency(RF) signals, comprising
   means for receiving a baseband input signal,
   means for splitting the received signal into two signals having a 90° phase difference,
   first and second paths for receiving each of the two split signals, each path including:
      means for digitally predistorting the input signal,
      means for converting the digitally predistorted signal into a low intermediate frequency,
      means for digital-to-analog converting the low intermediate frequency signal,
      means for frequency converting the analog signal into a radio frequency (RF) signal,
      means for performing analog predistortion on the RF signal, and
      means for amplifying the analog predistorted signal, and means for combining both the amplified signals.

5. A power amplifier according to claim 4, wherein the analog predistortion means is configured to perform the analog predistortion adaptively by extracting an error signal component from the output of the amplifier to be used for adjusting the predistorted signals in accordance with an amplifier error behavior.

6. A power amplifier according to claim 4, wherein the digital predistortion means is configured to perform the digital predistortion adaptively by extracting an error signal component from the output of the amplifier and adjusting the predistortion signal in accordance with an amplifier error behavior in real-time operation.

7. A power amplifier for linear amplification of radio frequency(RF) signals, comprising
   a splitter for splitting a baseband input signal into two signals having a 90° phase difference,
   first and second paths for receiving each of the two split signals, each path including:
      a digital predistorter for digitally predistorting the input signal,
      a first frequency converter for converting the digitally predistorted signal into a low intermediate frequency,
      a digital-to-analog converter for digital-to-analog converting the low intermediate frequency signal,
      a second frequency converter for frequency converting the analog signal into a radio frequency (RF) signal,
      an analog predistorter for performing analog predistortion on the RF signal, and
      an amplifier for amplifying the analog predistorted signal, and a combiner for combining both the amplified signals.

8. A power amplifier according to claim 7, wherein the analog predistorter is configured to perform the analog predistortion adaptively by extracting an error signal component from the output of the amplifier to be used for adjusting the predistorted signals in accordance with an amplifier error behavior.

9. A power amplifier according to claim 7, wherein the digital predistorter is configured to perform the digital predistortion adaptively by extracting an error signal component from the output of the amplifier and adjusting the predistortion signal in accordance with an amplifier error behavior in real-time operation.

* * * * *